United States Patent
Lee et al.

(10) Patent No.: US 10,008,578 B1
(45) Date of Patent: Jun. 26, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hao-Ming Lee, Hsinchu County (TW); Sheng-Hao Lin, Hsinchu County (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/642,324

(22) Filed: Jul. 5, 2017

(30) Foreign Application Priority Data

Jun. 6, 2017 (TW) .............................. 106118681 A

(51) Int. Cl.
| | |
|---|---|
| *H01L 21/70* | (2006.01) |
| *H01L 29/49* | (2006.01) |
| *H01L 21/28* | (2006.01) |
| *H01L 29/66* | (2006.01) |

(52) U.S. Cl.
CPC .... *H01L 29/4991* (2013.01); *H01L 21/28088* (2013.01); *H01L 29/4966* (2013.01); *H01L 29/66545* (2013.01)

(58) Field of Classification Search
CPC ........... H01L 29/4991; H01L 29/66545; H01L 29/4966; H01L 21/28088
See application file for complete search history.

(56) References Cited

U.S. PATENT DOCUMENTS

| | | | |
|---|---|---|---|
| 8,642,424 B2 | 2/2014 | Jain et al. | |
| 9,252,233 B2 | 2/2016 | Hsiao et al. | |
| 9,716,158 B1 * | 7/2017 | Cheng | H01L 29/4991 |
| 9,735,047 B1 * | 8/2017 | Chang | H01L 21/7682 |
| 9,911,824 B2 * | 3/2018 | Ching | H01L 29/785 |
| 2006/0046449 A1 * | 3/2006 | Liaw | H01L 21/76897 438/585 |
| 2011/0309416 A1 * | 12/2011 | Yamashita | H01L 21/764 257/288 |
| 2013/0248950 A1 * | 9/2013 | Kang | H01L 29/78 257/288 |
| 2017/0365659 A1 * | 12/2017 | Cheng | H01L 29/6653 |
| 2018/0090593 A1 * | 3/2018 | Cheng | H01L 29/6653 |

OTHER PUBLICATIONS

Lin, Title of Invention: Semiconductor Structure and Method for Manufacturing the Same, U.S. Appl. No. 15/011,996, filed Feb. 1, 2016.

* cited by examiner

*Primary Examiner* — Victor A Mandala
(74) *Attorney, Agent, or Firm* — Winston Hsu

(57) ABSTRACT

A method for fabricating semiconductor device includes the steps of first forming a metal gate on a substrate and a spacer around the metal gate, in which the metal gate comprises a high-k dielectric layer, a work function metal layer, and a low-resistance metal layer. Next, part of the high-k dielectric layer is removed to form an air gap between the work function metal layer and the spacer.

8 Claims, 5 Drawing Sheets

SEMICONDUCTOR DEVICE AND METHOD FOR FABRICATING THE SAME

BACKGROUND OF THE INVENTION

1. Field of the Invention

The invention relates to a semiconductor device, and more particularly to a semiconductor device having air gap between work function metal layer and spacer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the resistance value of metal gates plays an important role in the performance of the FinFET device. Since metal gate transistor architecture today is still insufficient in achieving desirable performance, how to improve the design of current transistor structure has become an important task in this field.

SUMMARY OF THE INVENTION

According to an embodiment of the present invention, a method for fabricating semiconductor device includes the steps of first forming a metal gate on a substrate and a spacer around the metal gate, in which the metal gate comprises a high-k dielectric layer, a work function metal layer, and a low-resistance metal layer. Next, part of the high-k dielectric layer is removed to form an air gap between the work function metal layer and the spacer.

According to another aspect of the present invention, a semiconductor device includes a metal gate on a substrate and a spacer around the metal gate. Preferably, the metal gate includes a high-k dielectric layer, a work function metal layer on the high-k dielectric layer, and a low-resistance metal layer, and an air gap is disposed between the work function metal layer and the spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
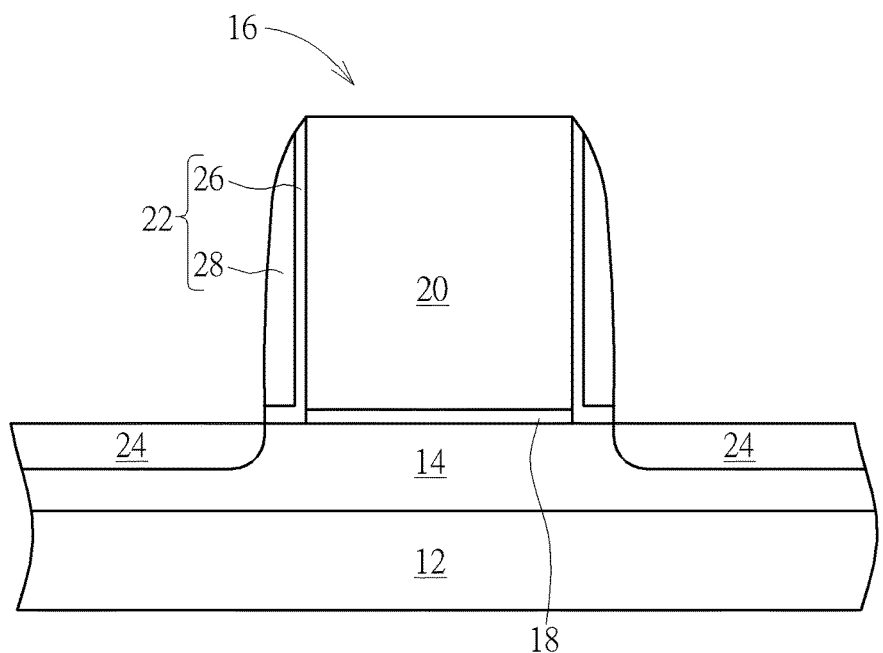
FIGS. 1-9 illustrate a method for fabricating semiconductor device according to an embodiment of the present invention.

Referring to FIGS. 1-9, FIGS. 1-9 illustrate a method for fabricating semiconductor device according to a preferred embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12. At least a fin-shaped structure 14 and an insulating layer (not shown) are formed on the substrate 12, in which the bottom portion of the fin-shaped structure 14 is surrounded by the insulating later or shallow trench isolation (STI) preferably made of material such as silicon oxide. It should be noted that even though this embodiment pertains to the fabrication of a non-planar FET device such as FinFET device, it would also be desirable to apply this content of the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structures 16 or dummy gate is formed on the substrate 12. In this embodiment, the formation of the gate structure 16 could be accomplished by a gate first process, a high-k first approach from gate last process, or a high-k last approach from gate last process. Since this embodiment pertains to a high-k last approach, a gate dielectric layer or interfacial layer, a gate material layer, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, a gate structure 16 composed of patterned gate dielectric layer 18 and patterned material layer 20 are formed on the substrate 12.

Next, at least a spacer 22 is formed on the sidewalls of the gate structure 16, a source/drain region 24 and/or epitaxial layer (not shown) is formed in the substrate 12 adjacent to two sides of the spacer 22, and a selective silicide layer (not shown) could be formed on the surface of the source/drain region 24. In this embodiment, the spacer 22 could be a single spacer or a composite spacer, such as a spacer including but not limited to for example an offset spacer 26 and a main spacer 28. Preferably, the offset spacer 26 and the main spacer 28 could include same material or different material while both the offset spacer 26 and the main spacer 28 could be made of material including but not limited to for example $SiO_2$, SiN, SiON, SiCN, or combination thereof. The source/drain region 24 could include n-type dopants or p-type dopants depending on the type of device being fabricated.

Figure 2:
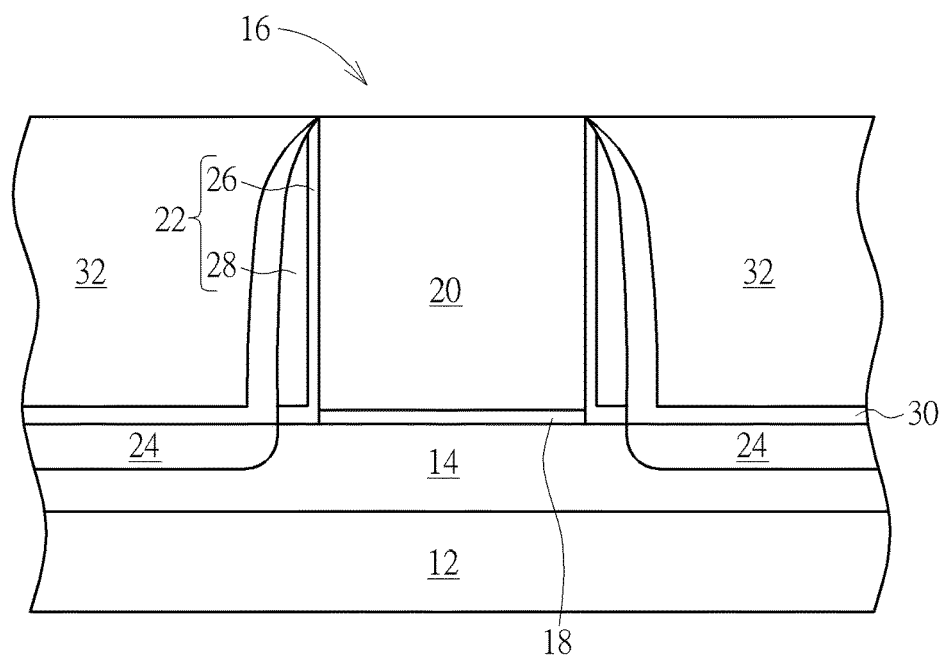

Next, as shown in FIG. 2, a contact etch stop layer (CESL) 30 is formed on the substrate 12 surface and the gate structure 16, and an interlayer dielectric (ILD) layer 32 is formed on the CESL 30 afterwards. Next, a planarizing process such as a chemical mechanical polishing (CMP) process is conducted to remove part of the ILD layer 32 and part of the CESL 30 to expose the gate material layer 20 composed of polysilicon so that the top surfaces of the gate material layer 20 and ILD layer 32 are coplanar.

Figure 3:
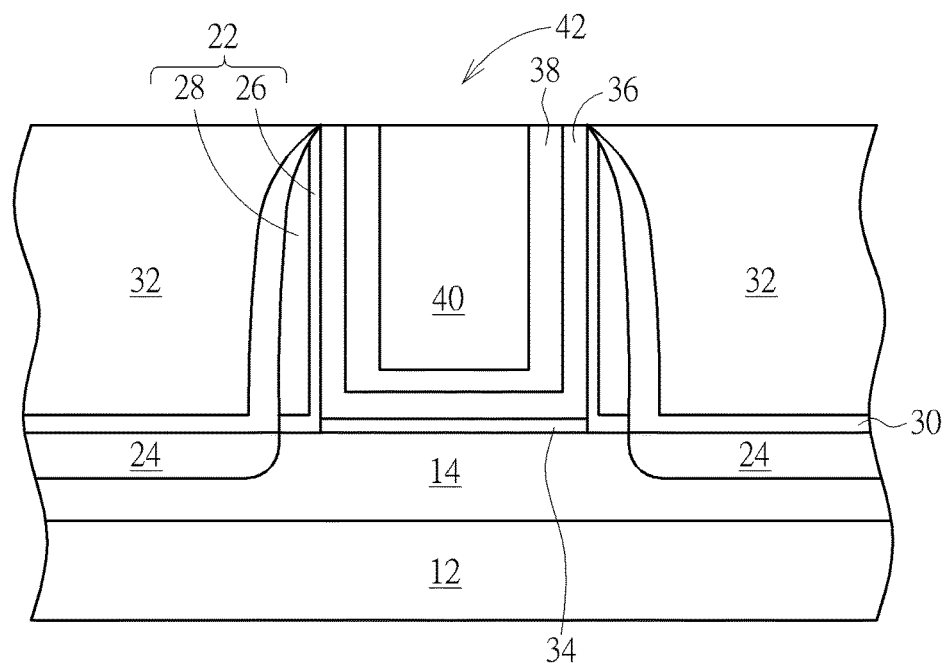

Next, as shown in FIG. 3, a replacement metal gate (RMG) process is conducted to transform the gate structure 16 into a metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 20 or even gate dielectric layer 18 from gate structure 16 for forming a recess (not shown) in the ILD layer 32. Next, a selective interfacial layer 34 or gate dielectric layer (not shown), a high-k dielectric layer 36, a work function metal layer 38, and a low resistance metal layer 40 are formed in the recesses, and a planarizing process such as CMP is conducted to remove part of low resistance metal layer 40, part of work function metal layer 38, and part of high-k dielectric layer 36 to form metal gate 42. In this embodiment, the gate structure or metal gate 42 fabricated through high-k last process of a gate last process preferably includes an interfacial layer 34 or gate dielectric layer (not shown), a U-shaped high-k dielectric layer 36, a U-shaped work function metal layer 38, and a low resistance metal layer 40.

In this embodiment, the high-k dielectric layer 36 is preferably selected from dielectric materials having dielectric constant (k value) larger than 4. For instance, the high-k dielectric layer 36 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 38 is formed for tuning the work function of the metal gate in accordance with the conductivity of the device. For an NMOS transistor, the work function metal layer 38 having a work function ranging between 3.9 eV and 4.3 eV may include titanium aluminide (TiAl), zirconium aluminide (ZrAl), tungstenaluminide (WAl), tantalumaluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 38 and the low resistance metal layer 40, in which the material of the barrier layer may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof.

Figure 4:
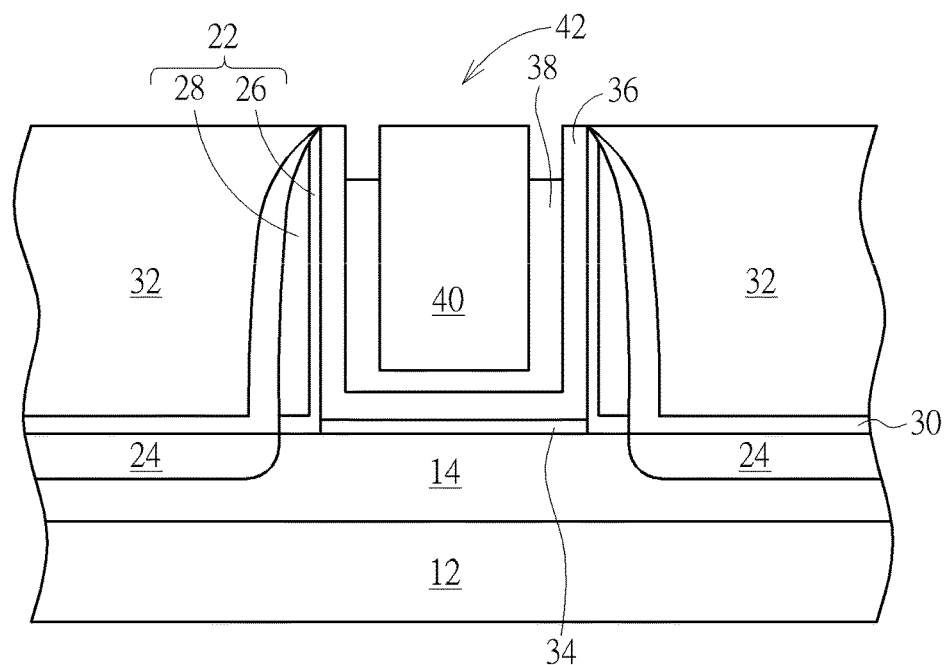

Next, as shown in FIG. 4, a first etching process is conducted to remove part of the work function metal layer 38. Specifically, the first etching process conducted at this stage is accomplished by using the selectivity between the work function metal layer 38 and the low resistance material layer 40 to remove part of the work function metal layer 38 without damaging or consuming the low resistance metal layer 40 and high-k dielectric layer 36 on the two sides while no patterned mask is formed. By doing so, the top surface of the remaining work function metal layer 38 is slightly lower than the top surface of the low resistance metal layer 40.

Figure 5:
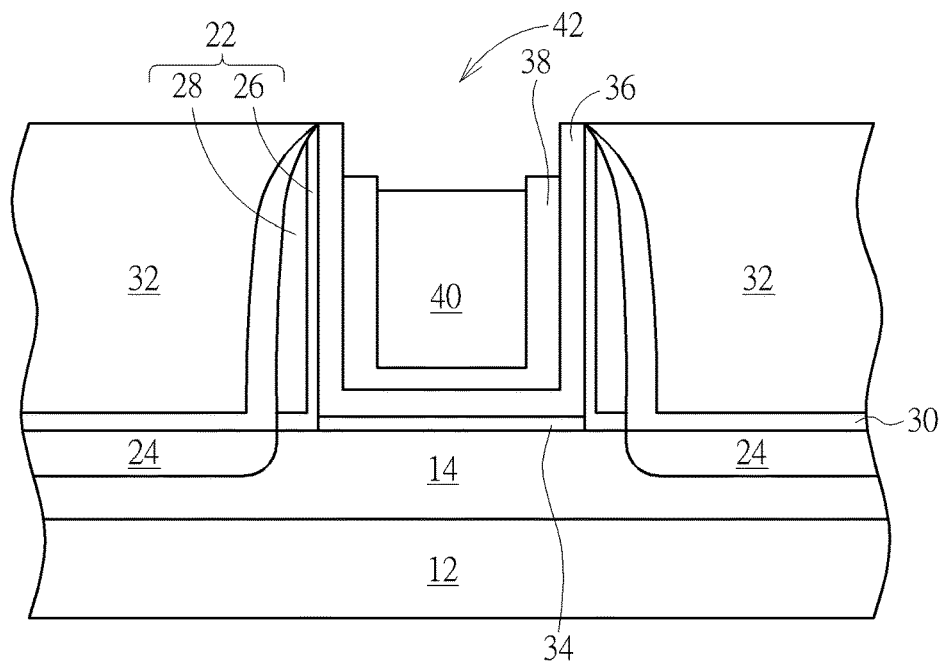

Next, as shown in FIG. 5, a second etching process is conducted to remove part of the low resistance metal layer 40. Similar to the first etching process, the second etching process conducted at this stage is accomplished by using the selectivity between the work function metal layer 38 and the low resistance metal layer 40 to remove part of the low resistance metal layer 40 without damaging or consuming the adjacent work function metal layer 38 and the high-k dielectric layer 36 while no patterned mask is being used. In other words, the top surfaces of the work function metal layer 38 and high-k dielectric layer 36 are kept at the same level or same height as the ones shown in FIG. 4. After the second etching process is conducted, the top surface of the low resistance metal layer 40 becomes slightly lower than the top surface of the work function metal layer 38 or the top surface of the work function metal layer 38 becomes higher than the top surface of the low resistance metal layer 40.

Figure 6:
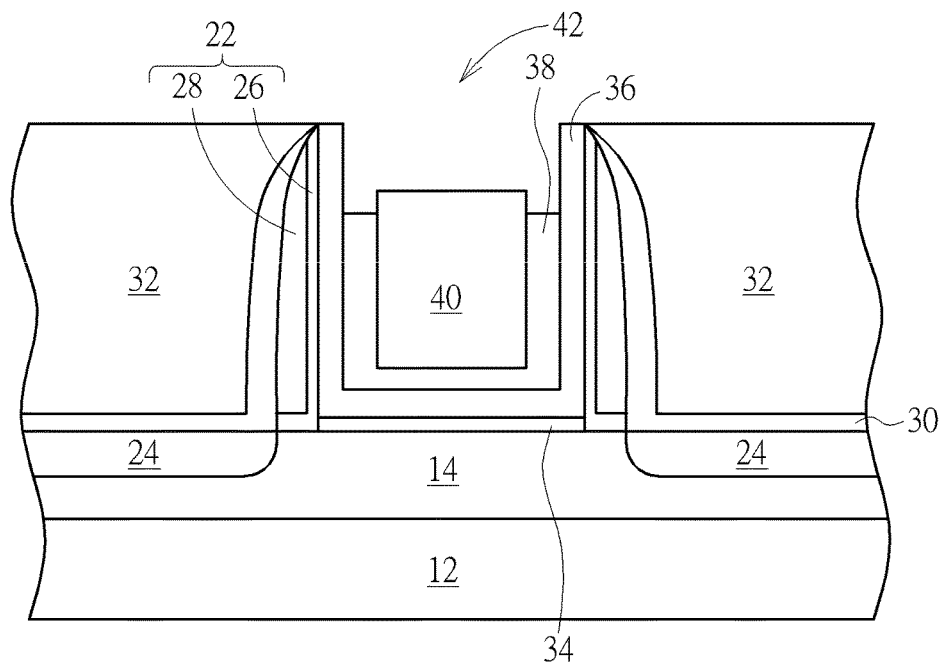

Next, as shown in FIG. 6, a third etching process is conducted to further remove part of the work function metal layer 38. Similar to the first etching process, the third etching process conducted at this stage is accomplished by using the selectivity between the work function metal layer 38 and the low resistance metal layer 40 to remove part of the work function metal layer 38 without damaging or consuming the adjacent low resistance metal layer 40 and high-k dielectric layer 36 while no patterned mask is being used. This further lowers the top surface of the work function metal layer 38 so that the top surface of the work function metal layer 38 is lower than the top surface of the low resistance metal layer 40 or the top surface of the low resistance metal layer 40 being higher than the top surface of the work function metal layer 38. At this stage the top surfaces of the remaining work function metal layer 38 and low resistance metal layer 40 are both lower than the top surface of the high-k dielectric layer 36 and ILD layer 32.

Figure 7:
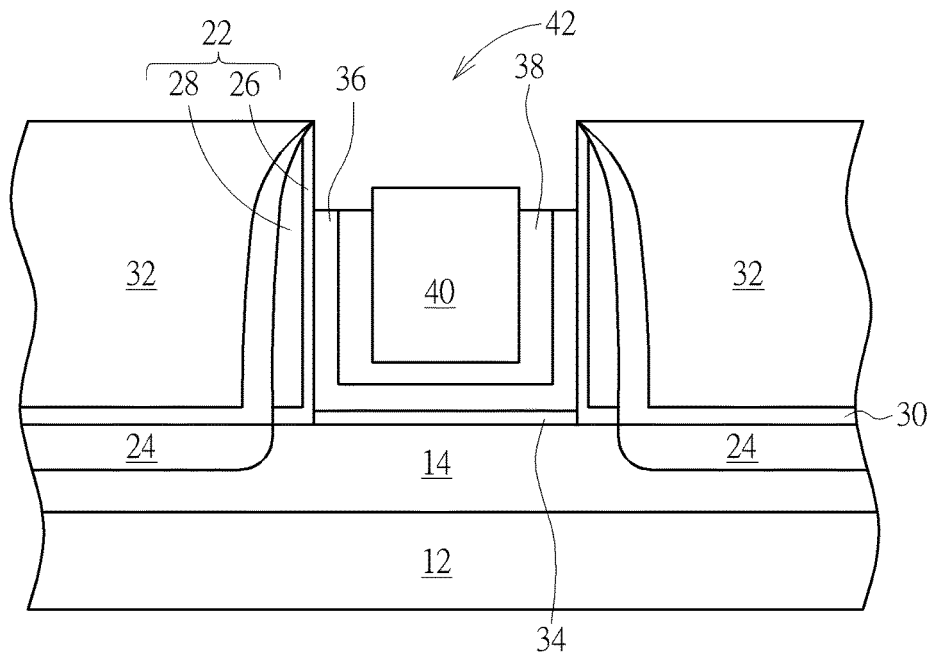

Next, as shown in FIG. 7, a fourth etching process is conducted to remove part of the high-k dielectric layer 36. Specifically, the fourth etching process conducted at this stage is accomplished by using etching gas including but not limited to for example $Cl_2$ and/or $BCl_3$ to remove part of the high-k dielectric layer 36 without damaging or consuming the adjacent spacer 22, work function metal layer 38, and low resistance metal layer 40 while no patterned mask is used. Consequently, the top surface of the remaining high-k dielectric layer 36 is substantially even with the top surface of the work function metal layer 38.

Figure 8:
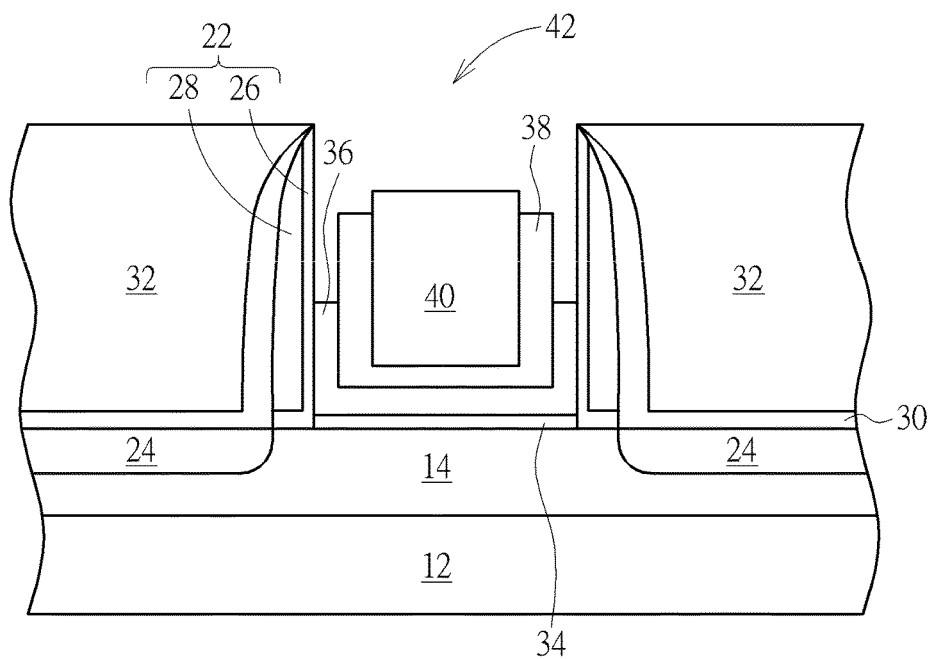

Next, as shown in FIG. 8, a fifth etching process is conducted to further remove part of the high-k dielectric layer 36 so that the top surface of the high-k dielectric layer 36 is lower than the top surface of the work function metal layer 38, in which the top surface of the remaining high-k dielectric layer 36 could be controlled to stop at approximately half the height of the work function metal layer 38. In this embodiment, the gas content used in the fifth etching process could be the same as the ones used in the fourth etching process for removing part of the high-k dielectric layer 36, but not limited thereto.

Figure 9:
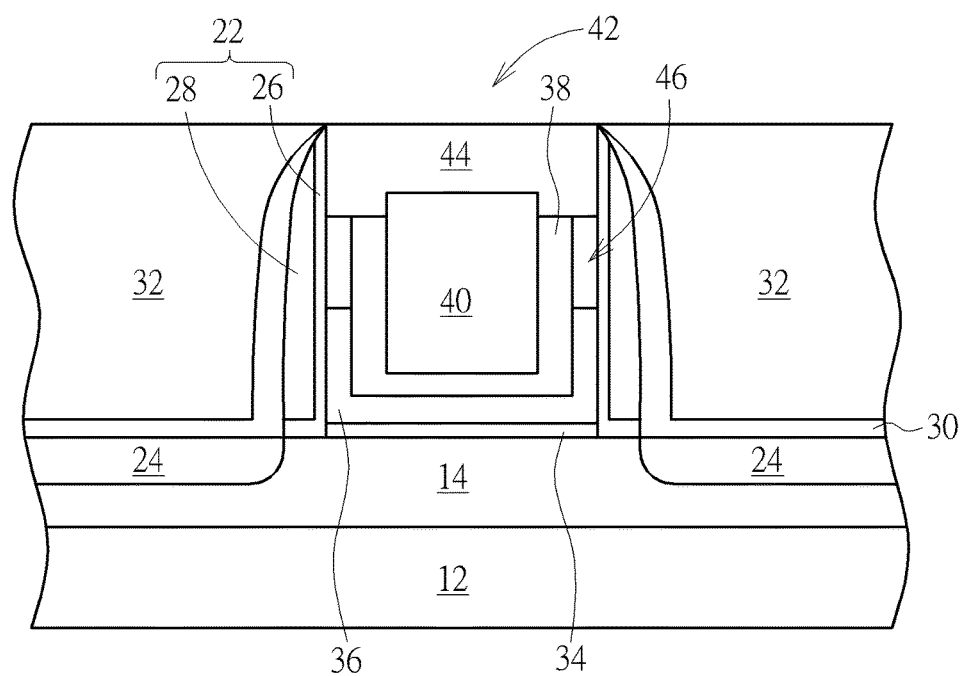

Next, as shown in FIG. 9, a hard mask 44 is formed on the work function metal layer 38 and the low resistance metal layer 40 within the recess, and a planarizing process such as CMP and/or etching back process could be conducted to remove part of the hard mask 44 so that the top surfaces of the hard mask 44 and the ILD layer 32 are coplanar. It should be noted that since the height of the high-k dielectric layer 36 has already been lowered to a level such as lower than half the height of the spacer 22 before the hard mask 44 is formed, it would be desirable to form air gaps 46 between the work function metal layer 38 and the spacer 22 during the formation of the hard mask 44 while the hard mask 44 not filling the space between the work function metal layer 38 and the spacer 22 completely. In other words, the air gaps 46 is disposed between the hard mask 44 and the high-k dielectric layer 36 or viewing from another perspective, each of the air gap 46 is enclosed by the high-k dielectric layer 36, the spacer 22, the hard mask 44, and the work function metal layer 38 at the same time. In this embodiment, the hard mask 44 could be made of dielectric material including but not limited to for example $SiO_2$, SiN, SiON, SiCN, or combination thereof.

Next, a contact plug formation process could be conducted to form contact plugs (not shown) in the ILD layer 32 to electrically connect to the source/drain region 24 adjacent to two sides of the spacer 22. This completes the fabrication of a semiconductor device according to an embodiment of the present invention.

Referring again to FIG. 9, in which FIG. 9 further illustrates a structural view of a semiconductor device according to an embodiment of the present invention. As shown in FIG. 9, the semiconductor device preferably includes a metal gate 42 disposed on the substrate 12, at least a spacer 22 around the metal gate 42, source/drain region 24 disposed in the substrate 12 or fin-shaped structure 14 adjacent to two sides of the spacer 22, a CESL 30 disposed on the spacer 22, an ILD layer 32 surrounding the spacer 22 and the CESL 30, and a hard mask 44 disposed on the metal gate 42.

Specifically, the metal gate 42 includes a high-k dielectric layer 36, a work function metal layer 38 on the high-k dielectric layer 36, and a low resistance metal layer 40 on the work function metal layer 38. Preferably, both the high-k dielectric layer 36 and work function metal layer 38 are U-shaped, the top surface of the low resistance metal layer 40 is higher than the top surface of the work function metal layer 38, and the top surface of the U-shaped work function metal layer 38 is higher than the top surface of the U-shaped high-k dielectric layer 36.

In this embodiment, an air gap 46 is formed between the work function metal layer 38 and the spacer 22 on two sides of the metal gate 42, in which each of the air gaps 46 is completely hollow and the top surface of the air gap 46 is even with the top surface of the work function metal layer 38. The bottom surface of the air gap 46 on the other hand is aligned with half the height of the work function metal layer 38. Viewing from another perspective, each of the air gaps 46 is enclosed by the high-k dielectric layer 36, spacer 22, hard mask 44, and work function metal layer 38 at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a metal gate on a substrate, wherein the metal gate comprises:
      a high-k dielectric layer;
      a work function metal layer on the high-k dielectric layer; and
      a metal layer on the work function metal layer;
   a spacer around the metal gate; and
   an air gap between the work function metal layer and the spacer and contacts the high-k dielectric layer directly.

2. The semiconductor device of claim 1, wherein the high-k dielectric layer and the work function metal layer are U-shaped.

3. The semiconductor device of claim 1, wherein a top surface of the metal layer is higher than a top surface of the work function metal layer.

4. The semiconductor device of claim 1, wherein a top surface of the work function metal layer is higher than a top surface of the high-k dielectric layer.

5. The semiconductor device of claim 1, further comprising a hard mask on the work function metal layer and the metal layer.

6. The semiconductor device of claim 5, wherein the air gap is between the hard mask and the high-k dielectric layer.

7. The semiconductor device of claim 5, further comprising an interlayer dielectric (ILD) layer around the spacer.

8. The semiconductor device of claim 7, wherein the top surfaces of the hard mask and the ILD layer are coplanar.

* * * * *